United States Patent
Iwasaki et al.

(10) Patent No.: US 6,777,814 B2
(45) Date of Patent: Aug. 17, 2004

(54) SEMICONDUCTOR DEVICE (75) Inventors: Toshihiro Iwasaki, Tokyo (JP);
Michitaka Kimura, Tokyo (JP);
Keiichiro Wakamiya, Tokyo (JP);
Yasumichi Hatanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 55 days.

(21) Appl. No.: 10/170,588

(22) Filed: Jun. 14, 2002

(65) Prior Publication Data
US 2003/0111742 A1 Jun. 19, 2003

(30) Foreign Application Priority Data

Dec. 18, 2001 (JP) ........................................ 2001-384707

(51) Int. Cl.[7] .............................................. H01L 23/48
(52) U.S. Cl. ........................ 257/778; 257/657; 257/777; 257/781; 257/782; 257/783
(58) Field of Search .............................. 257/657, 777, 257/778, 781, 782, 783

(56) References Cited

U.S. PATENT DOCUMENTS 5,677,575 A * 10/1997 Maeta et al. ................ 257/778
6,232,668 B1 * 5/2001 Hikita et al. ................ 257/777

FOREIGN PATENT DOCUMENTS

JP    2001-015554    1/2001

* cited by examiner

Primary Examiner—Richard Elms
Assistant Examiner—Douglas Menz
(74) Attorney, Agent, or Firm—McDermott Will & Emery LLP (57) ABSTRACT A semiconductor device includes a semiconductor chip, and a circuit substrate disposed such that the circuit substrate faces the semiconductor chip and is electrically connected to the semiconductor chip through a connection conductor. A pad electrode and a terminal electrode are formed on a surface of the semiconductor chip and a surface of the circuit substrate, respectively. The connection conductor is connected between the pad electrode and the terminal electrode. The surface of the semiconductor and the surface of the circuit substrate face each other. A conductive dummy pattern is formed on the facing surface of the semiconductor chip or the circuit substrate. A space between the facing surfaces is filled with nonconductive resin. With this arrangement, it is possible to make uniform the temperature distribution between the facing surfaces, thereby making the temperature and the viscosity of the nonconductive resin uniform to reduce attenuation of ultrasonic waves.

9 Claims, 6 Drawing Sheets

SEMICONDUCTOR DEVICE

BACKGROUND OF THE INVENTION

1. Field of the Invention

The present invention relates to a semiconductor device, and particularly to a semiconductor device in which a semiconductor chip and a substrate are bonded together through a connection conductor by means of ultrasonic thermal compression bonding.

2. Background Art

Conventionally, when mounting a SAW (Surface Acoustic Wave) device, etc., Au bumps are formed on electrode pads on the device, and bonded to Au-plated terminal electrodes on a mounting substrate by means of thermal compression bonding and application of ultrasonic waves, which is referred to as "FCB". The SAW device has a size of 3 mm×3 mm or smaller with a few I/O electrodes. Accordingly, it employs only a few bumps.

When applying ultrasonic thermal compression bonding to a large-size multipin device such as a memory device, on the other hand, nonconductive resin must be injected between the chip and the mounting substrate to enhance the reliability. FIG. 10 includes schematic cross-sectional views sequentially showing process steps constituting a method for bonding a large-size multipin device and a circuit substrate together by the use of ultrasonic thermal compression bonding. First of all, connection conductors (bumps) 104 are formed on electrode pads 102 on a semiconductor chip 101 by the use of a wire bonding technique. Next, as shown in FIG. 10A, the semiconductor chip 101 is held by a holding tool such that the electrode pads 102 on the semiconductor chip 101 are aligned with terminal electrodes 106 on a circuit substrate 105.

Then, a load is imposed on the semiconductor chip 101 in such a way that the connection conductors 104 come into close contact with the terminal electrodes 106. In this state, ultrasonic vibration is applied to the semiconductor chip 101 to bond the connection conductors 104 and the terminal electrodes 106 together.

After that, as shown in FIG. 10B, nonconductive resin 107 is injected between the semiconductor chip 101 and the circuit substrate 105. FIG. 10C shows a state in which the nonconductive resin 107 has filled the space between the semiconductor chip 101 and the circuit substrate 105, indicating completion of the injection.

Figure 10A:
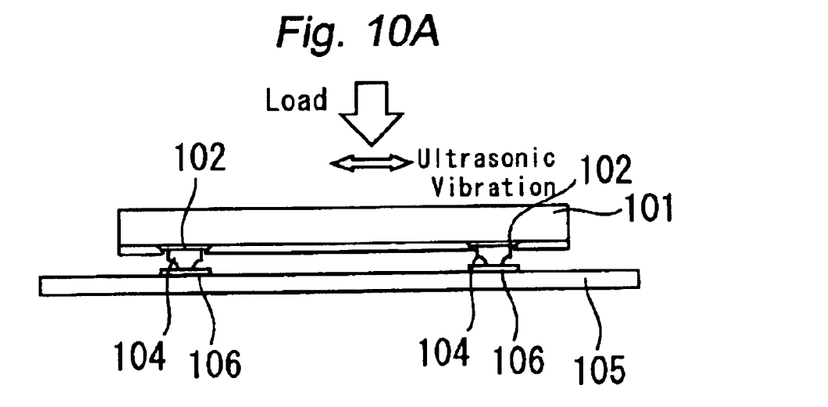
FIGS. 10A to 10C are schematic cross-sectional views sequentially showing process steps constituting a method for bonding a large-size multipin device and a circuit substrate together by the use of ultrasonic thermal compression bonding.
Figure 10B:
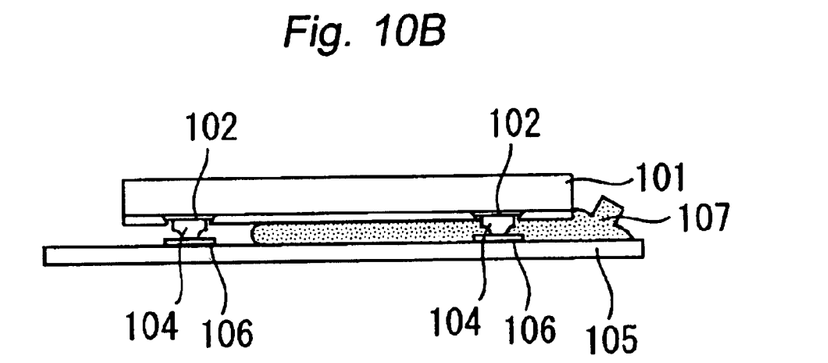
Figure 10C:
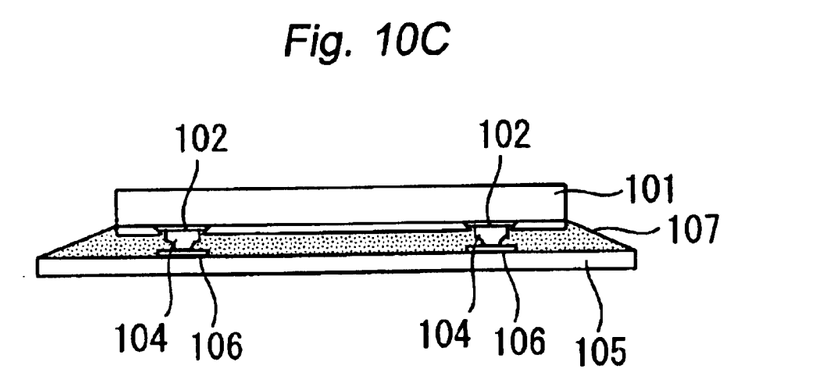

Since the applied ultrasonic vibration is attenuated after the resin has been injected, it is necessary to mount and bond the semiconductor chip 101 by means of ultrasonic thermal compression bonding before injecting the resin, as shown in FIG. 10.

If ultrasonic thermal compression bonding is applied to a large-size multipin memory device, however, the nonconductive resin cannot reach the center portion of the semiconductor chip 101 leaving the center portion unfilled as a void, since the area of the semiconductor chip 101 is too large. Therefore, conventionally, the resin sealing as shown in FIG. 10 has been difficult to accomplish after the compression bonding. Furthermore, the resin sealing after the compression bonding complicates the process.

To solve the above problems, a method has been adopted in which the nonconductive resin is spread over the circuit substrate beforehand, and the resin sealing is carried out at the same time with the bonding of the connection conductors 104 to the terminal electrodes 106. This method can omit the resin injection process after the ultrasonic thermal compression bonding.

To successfully apply this method, however, the viscosity of the resin at the time of the bonding is important. Specifically, a conventional problem occurs when the nonconductive resin is melted to seal the space between the semiconductor chip and the circuit substrate in the ultrasonic thermal compression bonding. Since the viscosity of the nonconductive resin is not uniform and differs from one area to another, the ultrasonic vibration is attenuated, resulting in insufficient bonding.

The temperature of the semiconductor chip is different from that of the circuit substrate before the semiconductor chip comes into contact with the circuit substrate, that is, before the semiconductor chip is contacted with the nonconductive resin on the circuit substrate. Because of this temperature difference, the temperature of the nonconductive resin is not uniform after the semiconductor chip 1 is brought into contact with the nonconductive resin. Furthermore, the heat conductivity of the semiconductor chip is also different from that of the circuit substrate, and each portion of the semiconductor chip and the circuit substrate includes a different component, also causing the nonconductive resin 7 not to be uniform.

Especially, consider the use of a glass epoxy substrate as the circuit substrate (a glass epoxy substrate uses epoxy resin, which is nonconductive). Its terminal electrodes are made of conductive materials and the other portions are made of nonconductive materials. Therefore, the temperature of the neighborhoods of the terminal electrodes is different from the temperature of the portions surrounding the neighborhoods due to the difference between the heat capacities of those materials. This nonuniform temperature distribution leads to a nonuniform viscosity distribution of the nonconductive resin. Since ultrasonic vibration does not propagate as well in the high-viscosity portion as in the low-viscosity portion due to the drag of the nonconductive resin, the applied ultrasonic vibration is attenuated after it is affected by the high-viscosity portion, resulting in insufficient bonding of the connection conductors to the terminal electrodes.

Furthermore, the glass epoxy substrate is made of materials which have a heat conductivity relatively lower than that of metals. Therefore, in the semiconductor chip 1, the temperature of its center is considerably different from that of its edges in the plane direction (the horizontal direction in the figure), producing a significantly-varying temperature distribution. As a result, the applied ultrasonic vibration and load are affected by the drag of the low-temperature, that is, high-viscosity portion of the nonconductive resin.

SUMMARY OF THE INVENTION

In view of the foregoing, the present invention has been made, and it is an object of the present invention to reliably carry out ultrasonic thermal compression bonding when mounting a large-size semiconductor device to enhance the reliability of the semiconductor device.

According to one aspect of the present invention, a semiconductor device comprises a semiconductor chip, an electronic component, electrodes, nonconductive resin, and a conductive dummy pattern. The electronic component is disposed such that the electronic component faces the semiconductor chip. The electronic component is electrically connected to the semiconductor chip through a connection conductor. The electrodes are each formed on a surface of the semiconductor chip and a surface of the electronic component. The electrodes has the connection conductor connected the electrodes. The surface of the semiconductor chip and the surface of the electronic component faces each other. The nonconductive resin is formed such that the nonconductive resin fills a space between the facing surfaces. The conductive dummy pattern is formed on the facing surface of the semiconductor chip or the electronic component.

Since a conductive dummy pattern is formed on a surface of a semiconductor chip facing an electronic component or a surface of an electronic component facing a semiconductor device, it is possible to make uniform the temperature distribution between the facing surfaces when the semiconductor chip and the electronic component are bonded together by means of ultrasonic thermal compression bonding, making the viscosity of the nonconductive resin uniform. With this arrangement, it is possible to reduce attenuation of the applied ultrasonic waves and thereby enhance the reliability of the electrical connection between the semiconductor chip and the electronic component.

Other and further objects, features and advantages of the invention will appear more fully from the following description.

DETAILED DESCRIPTION OF THE PREFERRED EMBODIMENTS

First Embodiment

FIG. 1 includes schematic cross-sectional views sequentially showing process steps constituting a method for fabricating a semiconductor device by the use of ultrasonic thermal compression bonding according to a first embodiment. The ultrasonic thermal compression bonding procedure of the first embodiment will be described below with reference to FIG. 1.

Figure 1A:
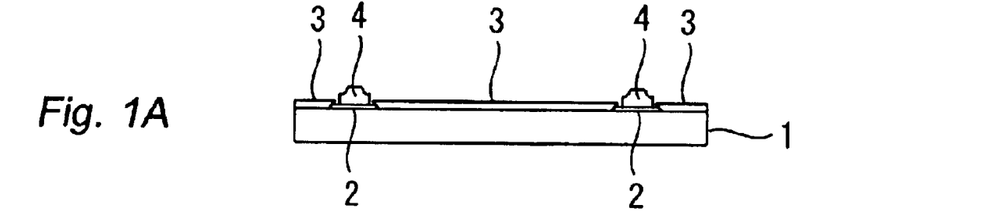
FIGS. 1A to 1E are schematic cross-sectional views sequentially showing process steps constituting a method for fabricating a semiconductor device by the use of ultrasonic thermal compression bonding according to a first embodiment.

First of all, connection conductors 3 are formed on electrode pads 2 on a semiconductor chip 1 by the use of a wire bonding technique, as shown in FIG. 1A. On the semiconductor chip 1, the areas which have no electrode pads 2 have an insulation protective film 3 formed thereon.

Figure 1B:
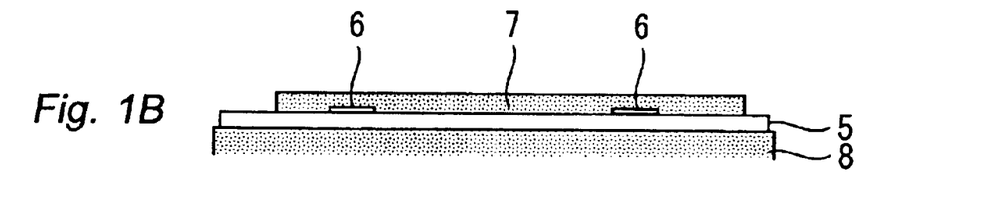

Next, as shown in FIG. 1B, nonconductive resin 7 is spread over a circuit substrate 5, which has terminal electrodes 6 thereon. For example, the nonconductive resin (layer) 7 is formed by adhering a sheet of nonconductive resin or coating the resin.

Figure 1C:
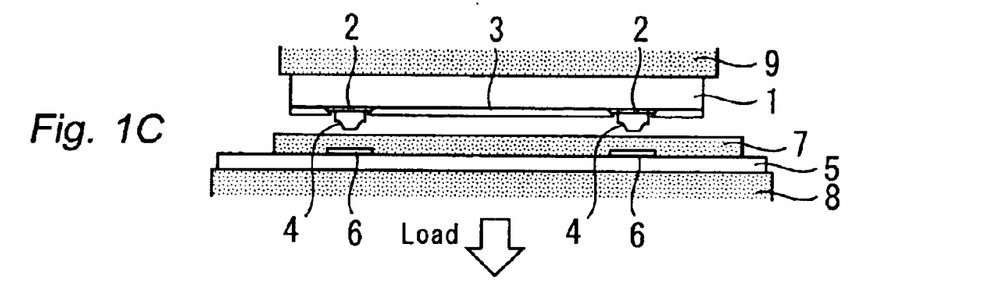

Then, as shown in FIG. 1C, the circuit substrate 5 is placed on a holding tool 8, and the semiconductor chip 1 is held by a holding tool 9 such that the circuit substrate 5 and the semiconductor 1 face each other and the electrode pads 2 on the semiconductor chip 1 are aligned with the terminal electrodes 6 on the circuit substrate 5.

Figure 1D:
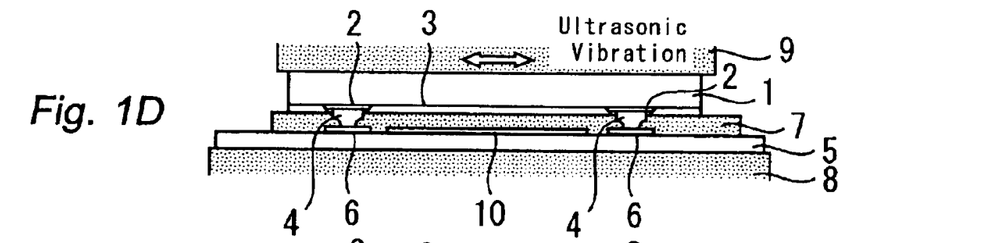
Figure 1E:
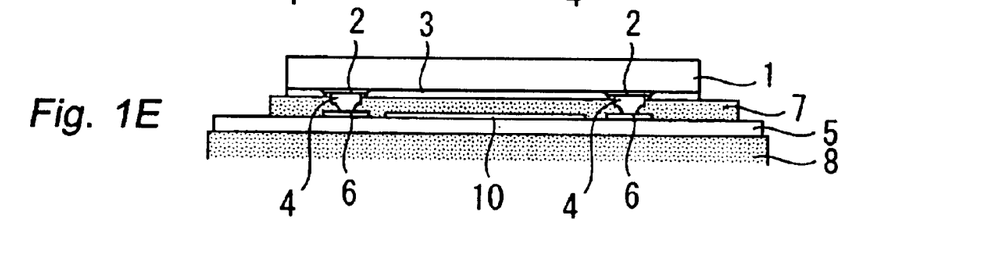

Then, as shown in FIG. 1D, the semiconductor chip 1 is brought into close contact with the circuit substrate 5, and a load and ultrasonic vibration are applied to bond the electrode pads 2 and the terminal electrode 6 together through connection conductors 4. Thus, as shown in FIG. 1E, the semiconductor chip 1 is mounted on the circuit substrate 5 and the space between the circuit substrate 5 and the semiconductor chip 1 is sealed with the nonconductive resin 7 after the above step shown in FIG. 1D.

At the process step shown in FIG. 1D, the nonconductive resin 7 provided on the circuit substrate 5 beforehand is melt and softened by the heat of the thermal compression bonding. The viscosity of the nonconductive resin 7 varies depending on the temperature. Generally, the larger the chip size of the semiconductor chip 1 is, the wider the viscosity distribution of the nonconductive resin 7 becomes. The first embodiment forms a dummy pattern 10 having good thermal conductivity on the surface of the circuit substrate 5 in order to make the temperature and viscosity distributions uniform even when using a chip of large size.

Figure 2A:
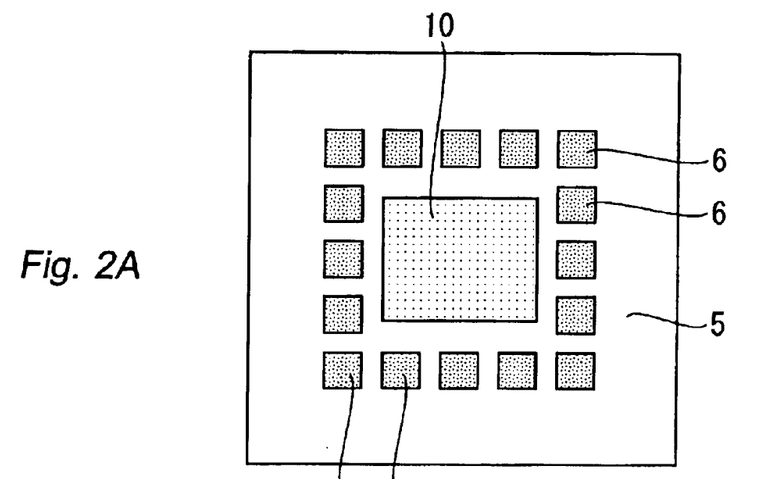
FIGS. 2A and 2B are schematic diagrams showing the dummy pattern formed on the circuit substrate.
Figure 2B:
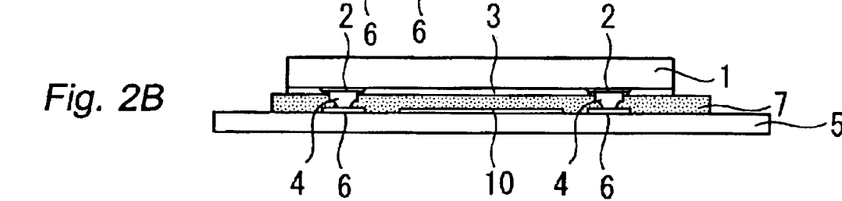

FIG. 2 is a schematic diagram (including FIG. 2A and FIG. 2B) showing the dummy pattern 10 formed on the circuit substrate 5. Specifically, FIG. 2A is a plan view showing the surface of the circuit substrate 5 on which the terminal electrodes 6 are formed. FIG. 2B, on the other hand, is a cross-sectional view of the circuit substrate 5 and the semiconductor chip 1.

As shown in FIG. 2A, on the circuit substrate 5, a plurality of the terminal electrodes 6 are formed near its edges. The dummy pattern 10 is formed at the center portion of the circuit substrate 5 and surrounded by the terminal electrodes 6. The dummy pattern 10 is formed of the same material as that for the terminal electrodes 6 and has the same thickness as that of the terminal electrodes 6, as shown in FIG. 2B. The dummy pattern 10 can be formed in a process in which the terminal electrodes 6 are formed.

Thus, the dummy pattern 10, which has good thermal conductivity and is made of the same material as that for the terminal electrodes 6, is formed at the center portion on the surface of the circuit substrate 5. Therefore, it is possible to make uniform the temperature distribution across the circuit substrate 5 when heat is applied at the step shown in FIG. 1D. Without the dummy pattern 10, enough heat does not propagate to the center portion of the circuit substrate 5, lowering the temperature of the center portion of the circuit substrate 5 as compared with that of the portions near the edges. The viscosity of the nonconductive resin 7 is high at the center portion of the circuit substrate 5. With the dummy pattern 10 provided, on the other hand, it is possible to make the temperature of the center portion of the circuit substrate 5 equal to that of the portions near the edges. This arrangement makes it possible to make the temperature of the entire area of the circuit substrate 5 uniform, obtaining a uniform temperature distribution across the nonconductive resin 7. That is, it is possible to reduce temperature differences among positions in the horizontal direction in the nonconductive resin 7.

The uniform temperature distribution across the nonconductive resin 7, obtained as described above, can lead to a uniform viscosity distribution across the nonconductive resin 7. In other words, the provision of the dummy pattern 10 makes it possible to lower the viscosity of the nonconductive resin 7 at the center portion of the circuit substrate 5 so that the viscosity at the center portion is equal to the viscosity in the portions near the edges. Thus, the viscosity of the nonconductive resin 7 can be prevented from increasing, thereby reducing the attenuation of the ultrasonic vibration.

Figure 3:
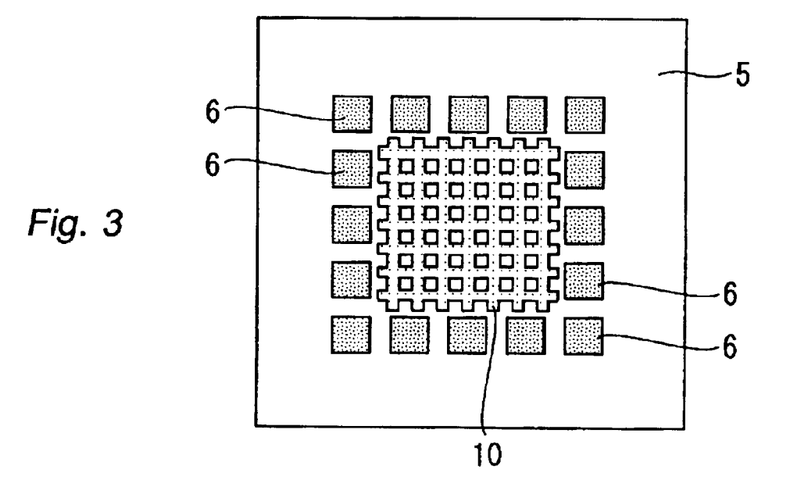
FIG. 3 is a plan view showing a shape of the dummy pattern.

FIG. 3 is a plan view showing a shape of the dummy pattern 10. The surface areas of the circuit substrate 5 which have no terminal electrodes 6 have their organic material portion exposed. As shown in FIG. 3, the dummy pattern 10 can be formed in a lattice pattern to increase the contact area between the organic material portion of the circuit substrate 5 and the nonconductive resin 7. With this arrangement, it is possible to enhance the bond strength between the nonconductive resin 7 and the circuit substrate 5.

Figure 4A:
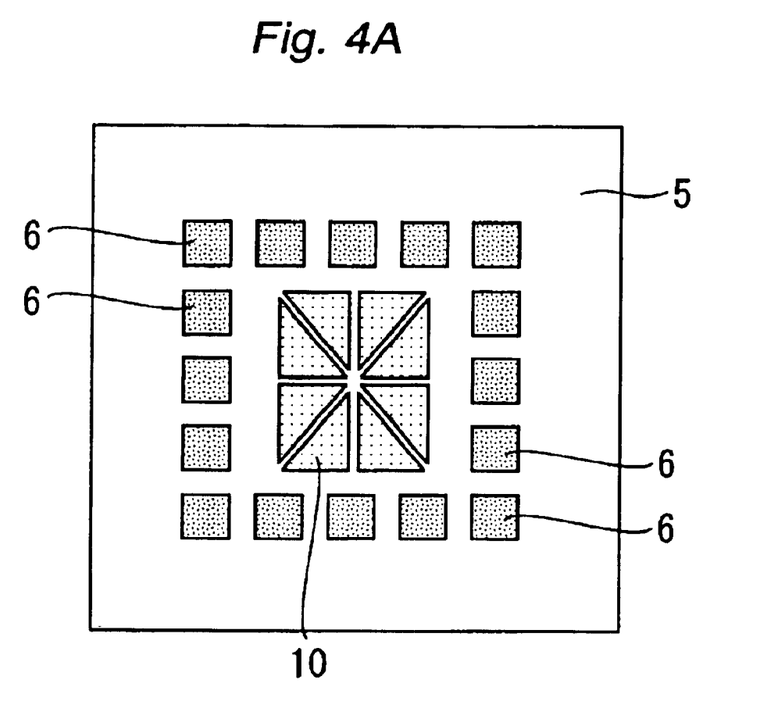
FIG. 4A is a plan view showing another shape of the dummy pattern.

FIG. 4A is a plan view showing another shape of the dummy pattern 10. As shown in FIG. 4, the dummy pattern 10 can be divided by radial spaces provided in the circuit substrate 5 to expel voids generated within the nonconductive resin 7 when the nonconductive resin 7 is formed or when the semiconductor chip 1 is bonded by means of thermal compression bonding. The voids are discharged through the radial spaces to the outside. It should be noted that the center of the radial spaces formed the dummy pattern 10 may be set at a position near the center of the semiconductor chip 1 to efficiently lead the voids from the center of the semiconductor chip 1 to the outside. With this arrangement, it is possible to minimize the number of voids generated and left within the nonconductive resin 7.

Figure 4B:
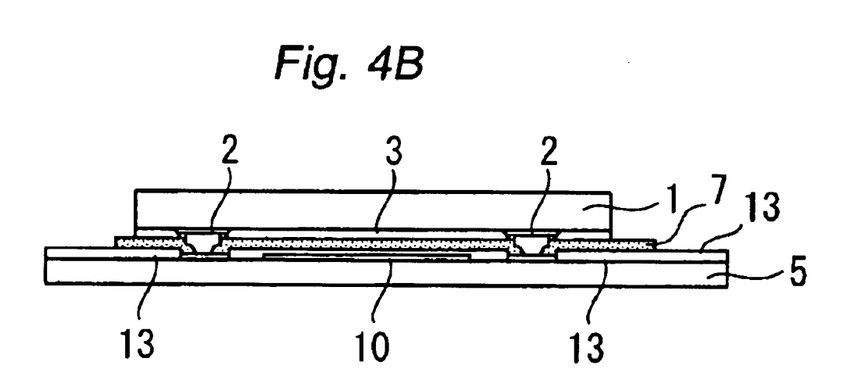
FIG. 4B is a schematic cross-sectional view of a semiconductor device having the dummy pattern shown in FIG. 4A.

FIG. 4B is a schematic cross-sectional view of a semiconductor device having the dummy pattern 10 shown in FIG. 4A. The semiconductor device shown in FIG. 4B covers the dummy pattern 10 on the circuit substrate 5 with an insulation protective film 13. The insulation protective film 13 is made of organic nonconductive resin, and the nonconductive resin 7 is also made of organic materials. Therefore, it is possible to make the temperature distribution across the circuit substrate 5 uniform, as in the case shown in FIGS. 1 and 2, and protect the surface of the circuit substrate 5 even when the circuit substrate 5 by the insulation protective film 13 is individually handled.

Further, as described above, the dummy pattern 10 may be formed in a process in which the terminal electrodes 6 on the circuit substrate 5 are formed. Alternatively, the dummy pattern 10 may be formed in a separate process, using a method in which, for example, a metal plate is adhered.

Still further, consider a case in which a semiconductor chip such as a silicon semiconductor chip is used as the circuit substrate 5. In such a case, both semiconductor chips 1 are held so that the "electrode pad 2" sides of both semiconductor chips 1 face each other with the nonconductive resin 7 disposed between them so as to be bonded together by the connection conductor 3. Also in this configuration, a dummy pattern can be formed to obtain the effects described above. In this case, the dummy pattern is formed on the surface of each semiconductor chip 1 on the "electrode pad 2" side. The dummy pattern may be made of the same materials as those for the electrode pads 2. Alternatively, it may be made up of metal patterns such as Cu patterns having good heat conductivity. With this arrangement, it is possible to make uniform the temperature of the nonconductive resin 7 between the semiconductor chips 1.

Figure 5A:
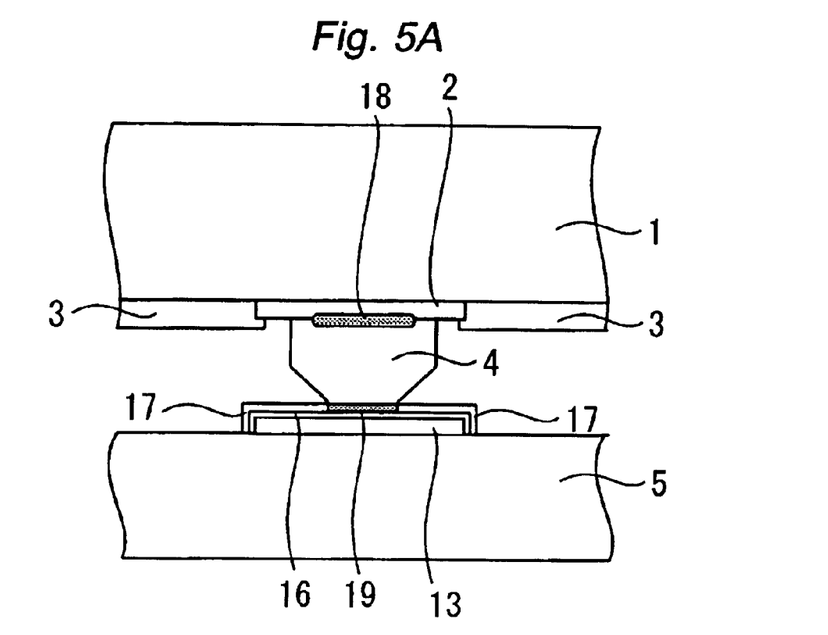
FIGS. 5A and 5B are schematic cross-sectional views of a bonded portion between the semiconductor chip and the circuit substrate.
Figure 5B:
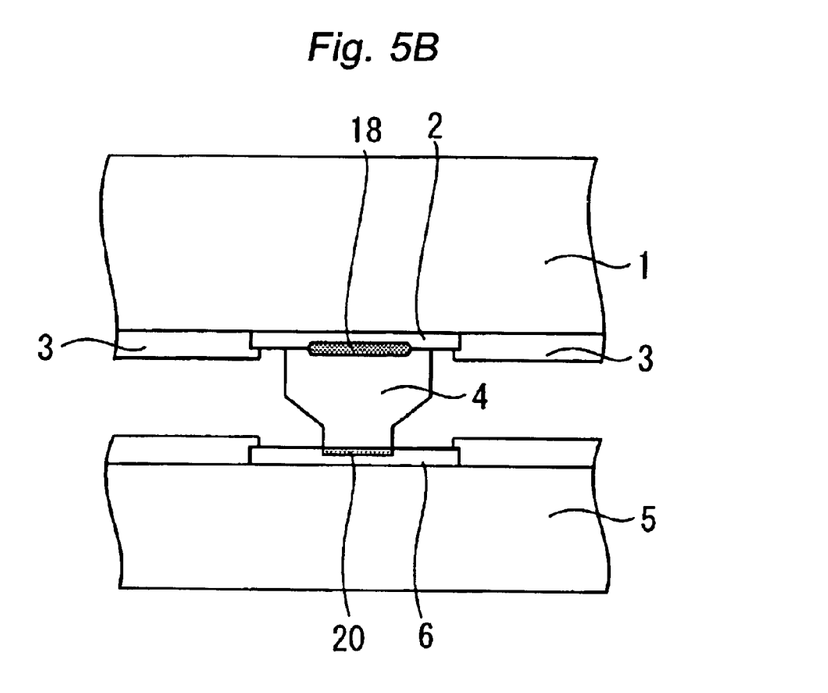

Next, a description will be made of connection components such as the electrode pads 2, the connection conductors 4, and the terminal electrodes 6 with reference to FIG. 5. FIG. 5 includes FIGS. 5A and 5B each showing a schematic cross-sectional view of a bonded portion between the semiconductor chip 1 and the circuit substrate 5. These connection components are each made of a material selected from a group consisting of Au, solder, Ag, Cu, Al, Bi, Zn, Sb, In, Pb, Si, and alloys thereof.

In FIG. 5A, for example, a component mainly including Au is used as the connection conductor 4, and the terminal electrode 6 on the circuit substrate 5 (glass epoxy substrate) is made up of a Cu electrode 13, an Ni-plated layer 16 formed on the Cu electrode 13, and an Au-plated layer 17 formed on the top. The connection conductor 4 is bonded to the electrode pad 2 by the use of a wire bonding technique beforehand, and an Au/Al alloy layer 18 is formed at the interface surface between the connection conductor 4 and the electrode pad 2.

Furthermore, as shown in FIG. 5A, an Au/Au bonding layer 19 is formed at the interface surface between the connection conductor 4 and the Au-plated layer 17 by ultrasonic thermal compression bonding at a relatively low temperature.

According to the first embodiment described above, since ultrasonic thermal compression bonding can be reliably carried out even for a large-size multipin semiconductor chip 1, it is possible to reliably form the Au/Au bonding layer 19 at the interface surface between the connection conductor 4 and the Au-plated layer 17, thereby bonding the connection conductor 4 and the terminal electrode 6 together with reliability.

FIG. 5B shows a case in which a component mainly including Au is also used as the connection conductor 4, and the circuit substrate 5 has been replaced with a semiconductor chip, that is, two semiconductor chips 1 have been bonded together. In this case, an Au/Al bonding layer 20 can be formed at the interface surface between the terminal electrode 6 and the connection conductor 4 at a relatively low temperature even when the terminal electrode 6 is a pad made of aluminum. According to the methods of the first embodiment described above, since thermal compression bonding using ultrasonic waves can be reliably carried out, it is possible to suitably form the Au/Au bonding layer 19 and the Au/Al bonding layer 20 even when using a material having a relatively low heat resistance temperature, such as the nonconductive resin 7 made of organic resin, considerably increasing the reliability of the bonding.

According to the first embodiment described above, since the dummy pattern 10 having a predetermined shape is formed on the "terminal electrode 6" side of the circuit substrate 5, it is possible to make uniform the temperature distribution across the top surface of the circuit substrate 5, thereby achieving a uniform temperature distribution across the nonconductive resin 7. With this arrangement, the viscosity of the nonconductive resin 7 at the time of ultrasonic thermal compression bonding can be made constant to prevent formation of a high-viscosity area at the center of the semiconductor chip 1. As a result, it is possible to reduce attenuation of applied ultrasonic vibration caused due to the high viscosity and thereby reliably bond the terminal electrode 6 and the connection conductor 4 together, enhancing the reliability of the semiconductor device.

Second Embodiment

Figure 6:
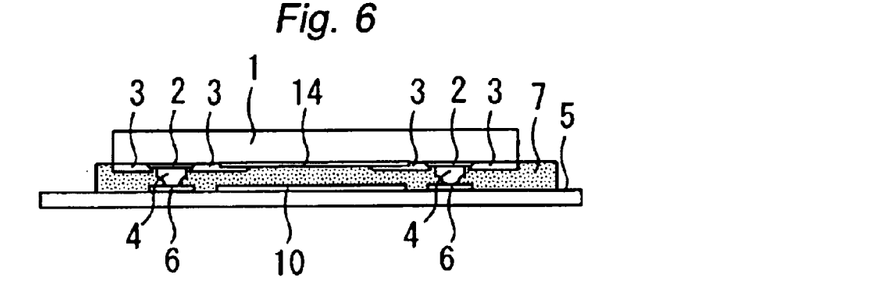
FIG. 6 is a schematic cross-sectional view of a semiconductor device according to a second embodiment of the present invention.

FIG. 6 is a schematic cross-sectional view of a semiconductor device according to a second embodiment of the present invention. As shown in the figure, in the semiconductor device of the second embodiment, the semiconductor chip 1 and the circuit substrate 5 are bonded together and the nonconductive resin 7 is injected between them, as is the case with the semiconductor device of the first embodiment. Furthermore, in the second embodiment, a dummy pattern 14 having good thermal conductivity is formed on the "semiconductor chip 1" side.

Thus, by forming the dummy pattern 14 having good thermal conductivity on the "semiconductor chip 1" side, it is possible to enhance the uniformity of the temperature distribution across the nonconductive resin 7, thereby reducing attenuation of the ultrasonic vibration to reliably carry out ultrasonic thermal compression bonding.

Figure 7:
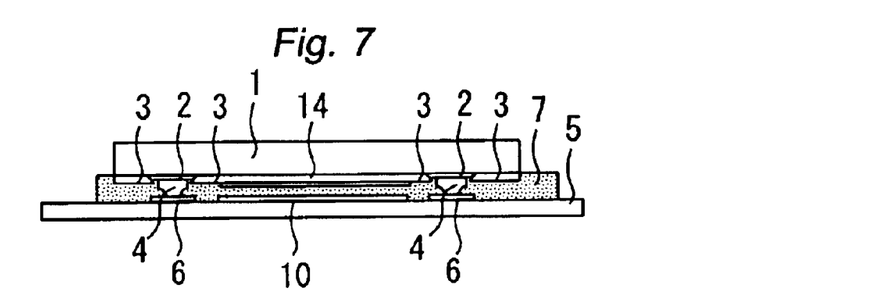
FIG. 7 is a schematic cross-sectional view of other semiconductor devices having a dummy pattern.
Figure 8:
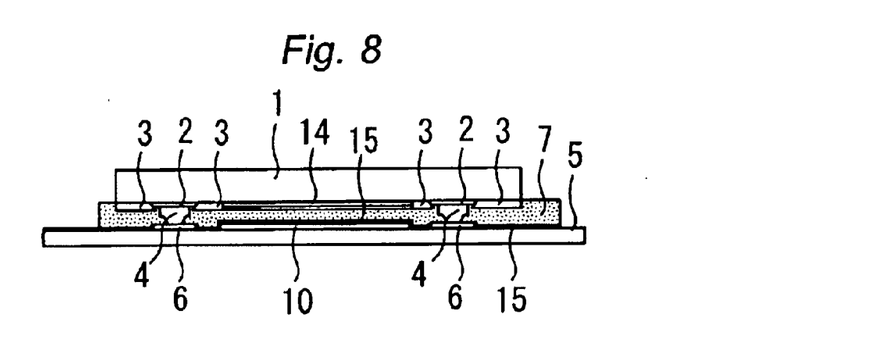
FIG. 8 shows a case in which solder resist is applied onto a glass epoxy substrate.

FIGS. 7 and 8 are schematic cross-sectional views of other semiconductor devices having a dummy pattern 14. In the semiconductor device shown in FIG. 7, the dummy pattern 14 is formed on the "electrode pad 2" side of the semiconductor chip 1, as is the case with the semiconductor device shown in FIG. 6. The semiconductor device in FIG. 7 is different from that in FIG. 6 in that the dummy pattern 14 is formed on the insulation protective film 3.

Both the nonconductive resin (layer) 7 and the insulation protective film 3 are insulation films made of organic materials. As shown in FIG. 7, even when the dummy pattern 14 is formed on the insulation protective film 3, the temperature distribution across the nonconductive resin 7 can be made uniform as in the case of FIG. 6.

FIG. 8 shows a case in which solder resist 15 is applied onto a glass epoxy substrate which is used as the circuit substrate 5. The solder resist 15 is also made up of an organic film. Therefore, placing the solder resist 15 between the circuit substrate 5 and the nonconductive resin 7 does not cause any significant change in the thermal conductivity of the circuit substrate 5. In the example shown in FIG. 8, the dummy pattern 14 is formed on a surface of the semiconductor chip 1 and covered with an insulation protective film 2, as in FIG. 6. Accordingly, it is possible to make the temperature of the nonconductive resin 7 uniform, as in the example shown in FIG. 6, as well as obtain the function provided by the solder resist 15.

As in the example of FIG. 3, the dummy pattern 14 can be formed in a lattice pattern to enhance the adhesion between the semiconductor chip 1 and the insulation protective film 3 or 13. Furthermore, as in the example of FIG. 4, the dummy pattern 14 can be divided by radial spaces to efficiently expel voids generated within the nonconductive resin 7 at the time of ultrasonic thermal compression bonding.

Third Embodiment

Figure 9:
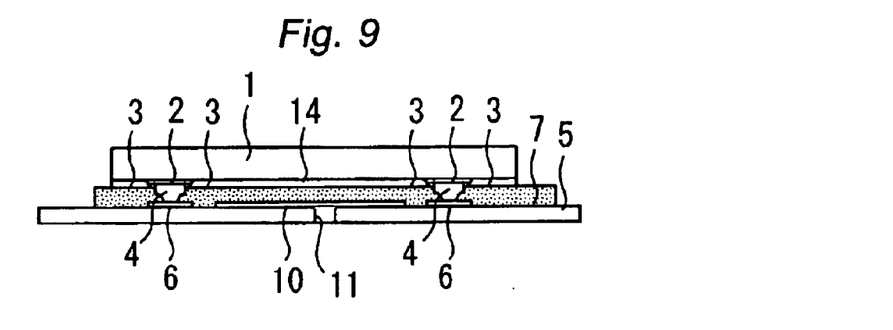
FIG. 9 is a schematic cross-sectional view of a semiconductor device using thermal compression bonding according to a third embodiment of the present invention.

FIG. 9 is a schematic cross-sectional view of a semiconductor device using thermal compression bonding according to a third embodiment of the present invention. In the third embodiment, a dummy pattern 10 is formed on the circuit substrate 5 as in the first embodiment, and furthermore a thermal via 11 is provided in the circuit substrate 5 so that heat to the circuit substrate 5 propagates well to the dummy pattern 10.

As shown in FIG. 9, the thermal via 11 provided in the circuit substrate 5 under the dummy pattern 10 is formed such that the thermal via 11 penetrates through the circuit substrate 5. The thermal via 11 is filled with part of the dummy pattern 10. This configuration is effective when heat is applied from the back of the circuit substrate 5 at the time of ultrasonic thermal compression bonding, since the dummy pattern 10 at the center portion of the circuit substrate 5 can be heated from the back of the circuit substrate 5 using the thermal via 11. With this arrangement, it is possible to increase the temperature of the nonconductive resin 7 at the center portion of the circuit substrate 5 so as to lower the viscosity of the nonconductive resin 7, thereby making the temperature uniform.

Further, when heat is applied from the back of the semiconductor chip 1 (that is, the heat is applied from above the semiconductor chip 1 in FIG. 9), a thermal via may be provided in the semiconductor chip 1. With this arrangement, it is possible to heat the "electrode pad 2" side of the semiconductor chip 1 through the thermal via to lower the viscosity of the nonconductive resin 7, thereby reducing attenuation of the ultrasonic waves and enhancing the reliability of the bonding.

According to the third embodiment described above, the thermal via 11 can be provided in the circuit substrate 5 or the semiconductor chip 1 to heat the nonconductive resin 7 through the thermal via 11. Therefore, it is possible to make the temperature distribution across the nonconductive resin 7 uniform, thereby realizing highly reliable ultrasonic thermal compression bonding.

Configured as described above, the present invention has the following effects.

Since a conductive dummy pattern is formed on a surface of a semiconductor chip facing an electronic component or a surface of an electronic component facing a semiconductor device, it is possible to make uniform the temperature distribution between the facing surfaces when the semiconductor chip and the electronic component are bonded together by means of ultrasonic thermal compression bonding, making the viscosity of the nonconductive resin uniform. With this arrangement, it is possible to reduce attenuation of the applied ultrasonic waves and thereby enhance the reliability of the electrical connection between the semiconductor chip and the electronic component.

Since a conductive dummy pattern is disposed such that it is surrounded by electrodes formed near edges of a semiconductor device, it is possible to make the temperature of the center portion of the semiconductor chip equal to that of the portions near the edges at the time of ultrasonic thermal compression bonding, decreasing the viscosity of the nonconductive resin at the center portion of the semiconductor chip.

Since a conductive dummy pattern is formed in a lattice pattern, it is possible to increase the contact area between the conductive dummy pattern and the semiconductor chip or the electronic component, enhancing the adhesion of the conductive dummy pattern.

Sine a conductive dummy pattern is divided by spaces radially extending from the center of the semiconductor chip, it is possible to efficiently expel voids generated within a nonconductive resin at the time of thermal compression bonding by leading the voids through the spaces to the outside.

Since a conductive dummy pattern and electrodes are made of the same materials, they can be formed in the same process on a semiconductor chip or an electronic component, thereby simplifying the entire process and reducing the cost.

By using a circuit substrate having a predetermined circuit pattern as the electronic component (described above), it is possible to enhance the reliability of the electrical connection between the semiconductor chip and the circuit substrate in a package such as a CSP.

By using another semiconductor chip as the electronic component (described above), it is possible to enhance the reliability of the electrical connection between both semiconductor chips.

Since an electrode is formed on a surface of a semiconductor chip facing an electronic component or a surface of an electronic component facing a semiconductor chip, through a protective insulation film, it is possible to make uniform the temperature distribution between the facing surfaces when the semiconductor chip and the electronic component are bonded together by means of ultrasonic thermal compression bonding, thereby making the viscosity of the nonconductive resin uniform.

Since a conductive dummy pattern is connected to the back of a facing surface through a thermal via, it is possible to efficiently propagate heat from the back of the facing surface to the conductive dummy pattern on the facing surface.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-384707, filed on Dec. 18, 2001 including specification, claims, drawings and summary, on which the Convention priority of the present application is based, are incorporated herein by reference in its entirety.

What is claimed is:

1. A semiconductor device comprising:

a semiconductor chip;

an electronic component disposed such that said electronic component faces said semiconductor chip and is electrically connected to said semiconductor chip through a connection conductor;

electrodes each formed on a surface of said semiconductor chip and a surface of said electronic component and having said connection conductor connected thereto, said surface of said semiconductor chip and said surface of said electronic component facing each other;

nonconductive resin formed such that said nonconductive resin fills a space between said facing surfaces; and a conductive dummy pattern formed on one of said facing surface of said semiconductor chip and that of said electronic component, said conductive dummy pattern arranged not to be in contact with the other facing surface opposing said facing surface on which said conductive dummy pattern is formed.

2. The semiconductor device according to claim 1, wherein said electrodes of said semiconductor chip and said electronic component are formed at positions set along edge portions of said semiconductor chip, and said conductive dummy pattern is formed such that said conductive dummy pattern is surrounded by said electrodes.

3. The semiconductor device according to claim 1, wherein said conductive dummy pattern is a lattice pattern.

4. The semiconductor device according to claim 1, wherein said conductive dummy pattern is divided by spaces radially extending from a position corresponding to a position near a center of said semiconductor chip.

5. The semiconductor device according to claim 1, wherein said conductive dummy pattern and said electrodes are made of a same material.

6. The semiconductor device according to claim 1, wherein said electronic component is a circuit substrate having a predetermined circuit pattern.

7. The semiconductor device according to claim 1, wherein said electronic component is a semiconductor chip.

8. The semiconductor device according to claim 1, wherein said electrodes are formed on said facing surface of said semiconductor chip or said electronic component through a protective insulation film.

9. The semiconductor device according to claim 1, wherein a thermal via is formed in said semiconductor chip or said electronic component, and said conductive dummy pattern is connected to a back of said facing surface through said thermal via.

\* \* \* \* \*